(12) United States Patent
Hu et al.

(10) Patent No.: US 8,752,274 B2
(45) Date of Patent: Jun. 17, 2014

(54) METHOD FOR MANUFACTURING LIGHT BAR THAT ENHANCES CENTRAL POINT BRIGHTNESS OF BACKLIGHT MODULE

(75) Inventors: Chechang Hu, Shenzhen (CN); Jing Zhang, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 165 days.

(21) Appl. No.: 13/577,249

(22) PCT Filed: Jun. 7, 2012

(86) PCT No.: PCT/CN2012/076547
§ 371 (c)(1),
(2), (4) Date: Aug. 4, 2012

(87) PCT Pub. No.: WO2013/177812
PCT Pub. Date: Dec. 5, 2013

(65) Prior Publication Data
US 2013/0318777 A1    Dec. 5, 2013

(30) Foreign Application Priority Data

Jun. 1, 2012 (CN) .......................... 2012 1 0178110

(51) Int. Cl.
*G01R 31/28* (2006.01)
(52) U.S. Cl.
USPC .................. 29/593; 29/829; 29/846; 29/874; 29/876

(58) Field of Classification Search
USPC ................... 29/593, 825, 829, 846, 874, 876; 257/99, E25.02, E33.059, E33.072; 362/84, 97.3, 240, 244, 255, 612, 613
See application file for complete search history.

(56) References Cited

U.S. PATENT DOCUMENTS 7,766,530 B2 * 8/2010 Hwang et al. ................. 362/613
2006/0157724 A1 * 7/2006 Fujita ............................ 257/99

* cited by examiner

*Primary Examiner* — Thiem Phan
(74) *Attorney, Agent, or Firm* — Cheng-Ju Chiang

(57) ABSTRACT

The present invention provides a method for mounting light bar that enhances central point brightness of backlight module, which includes (1) providing a PCB and LED lamps of different luminous intensities among which the difference is less than 20%; (2) positioning the LED lamps on the PCB in a spaced manner and electrically connected to the PCB; (3) providing a backlight module main body; (4) positioning the PCB with the LED lamps on the backlight module main body to form a the backlight module; (5) measuring central point brightness and illumination homogeneity; (6) adjusting the spacing distance between the LED lamps according to predetermined central point brightness and illumination homogeneity so as to have the central point brightness and illumination homogeneity of the LED lamps satisfying requirements; and (7) mounting the LED lamps to the PCB so as to form an LED light bar.

11 Claims, 4 Drawing Sheets

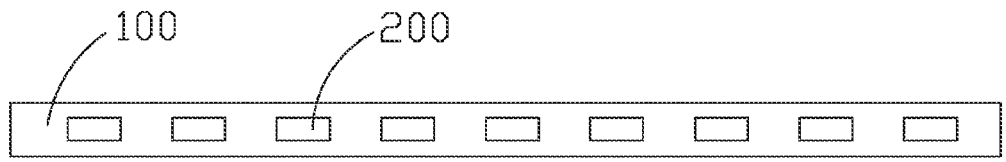

Fig. 1 (Prior Art)

| providing a PCB and a plurality of LED lamps of various specifications, wherein the LED lamps of various specifications are of different luminous intensities, difference of luminous intensity among the plurality of LED lamps being less than 20% | 1 |

| positioning the plurality of LED lamps on the PCB in a spaced manner and electrically connected to the PCB, wherein LED lamps having high luminous intensities are positioned at locations close to a central location of the PCB | 2 |

| providing a backlight module main body, wherein the backlight module main body is addible with a backlight source to form a backlight module | 3 |

| positioning the PCB on which the LED lamps are positioned on the backlight module main body to serve as a backlight source thereby forming the backlight module | 4 |

| measuring central point brightness and illumination homogeneity of the backlight module | 5 |

| adjusting the spacing distance between the LED lamps of the PCB according to predetermined central point brightness and illumination homogeneity so as to have the central point brightness and illumination homogeneity of the LED lamps satisfying requirements | 6 |

| mounting the LED lamps to the PCB so as to form an LED light bar | 7 |

Fig. 2

METHOD FOR MANUFACTURING LIGHT BAR THAT ENHANCES CENTRAL POINT BRIGHTNESS OF BACKLIGHT MODULE

BACKGROUND OF THE INVENTION

1. Field of the Invention

The present invention relates to the field of liquid crystal display, and in particular to a method for manufacturing a light bar that enhances central point brightness of a backlight module.

2. The Related Arts

Liquid crystal display (LCD) has a variety of advantages, such as thin device body, low power consumption, and being free of radiation, and is thus widely used. Most of the LCDs that are currently available in the market are backlighting LCDs, which comprise a liquid crystal panel and a backlight module. The working principle of the liquid crystal panel is that liquid crystal molecules are interposed between two parallel glass substrates and a plurality of vertical and horizontal fine electrical wires is arranged between the two glass substrates, whereby the liquid crystal molecules are controlled to change direction by application of electricity in order to refract light emitting from the backlight module for generating images. Since the liquid crystal panel itself does not emit light, light must be provided by the backlight module in order to normally display images. Thus, the backlight module is one of the key components of an LCD. The backlight module can be classified as two types, namely side-edge backlight module and direct backlight module, according to the position where light gets incident. The direct backlight module arranges a light source, such as a cold cathode fluorescent lamp (CCFL) or a light-emitting diode (LED) at the back side of the liquid crystal panel to form a planar light source that directly provides lighting to the liquid crystal panel. The side-edge backlight module arranges a LED light bar based backlight source at an edge of a back panel to be located rearward of one side of the liquid crystal panel. The LED light bar emits light that enters a light guide plate through a light incident face of the light guide plate and is projected out through a light exit face after being reflected and diffused to thereby form a planar light source for the liquid crystal panel.

Referring to FIG. 1, a conventional light bar of backlight source comprises a printed circuit board (PCB) 100 and a plurality of light-emitting diode (LED) lamps 200 mounted to the PCB 100. The plurality of LED lamps 200 are LED lamps of the same specification, such as all being 5630 or all being 7020. Besides the LED lamps 200 being of the same size, chip wires and chips contained in the LED lamps 200 are also identical. In addition, the spacing distance between adjacent LED lamps 200 is also fixed. This, to some extents, affects the central point brightness of a backlight module that includes the LED light bar backlight source.

SUMMARY OF THE INVENTION

An object of the present invention is to provide a method for mounting a light bar that enhances central point brightness of a backlight module, with which enhancement of brightness of a central point can be easily achieved and improved illumination homogeneity can be obtained so that the optic grade of the backlight module is improved and the cost is reduced.

To achieve the object, the present invention provides a method for mounting a light bar that enhances central point brightness of a backlight module, which comprises the following steps:

Step 1: providing a PCB and a plurality of LED lamps of various specifications, wherein the LED lamps of various specifications are of different luminous intensities, difference of luminous intensity among the plurality of LED lamps being less than 20%;

Step 2: positioning the plurality of LED lamps on the PCB in a spaced manner and electrically connected to the PCB, wherein LED lamps having high luminous intensities are positioned at locations close to a central location of the PCB;

Step 3: providing a backlight module main body, wherein the backlight module main body is addible with a backlight source to form a backlight module;

Step 4: positioning the PCB on which the LED lamps are positioned on the backlight module main body to serve as a backlight source thereby forming the backlight module;

Step 5: measuring central point brightness and illumination homogeneity of the backlight module;

Step 6: adjusting the spacing distance between the LED lamps of the PCB according to predetermined central point brightness and illumination homogeneity so as to have the central point brightness and illumination homogeneity of the LED lamps satisfying requirements; and Step 7: mounting the LED lamps to the PCB so as to form an LED light bar.

The plurality of LED lamps of various specifications is of two specifications.

The LED lamps of various specifications are LED lamps of different sizes or LED lamps of identical size but different types.

The e LED lamps of different types are LED lamps using different fluorescent powders or different driving conditions.

The LED lamps using different driving conditions are LED lamps using different driving voltages.

The backlight module main body of Step 3 comprises: a backplane, a light guide plate mounted on the backplane, a reflector plate arranged inside the backplane and located below the light guide plate, and an optic film assembly disposed on the light guide plate and the backlight source of Step 4 is arranged by one side of the light guide plate to form a side-edge backlight module.

The backlight module main body of Step 3 comprises: a backplane, a diffusion plate arranged above the backplane, a reflector plate arranged inside the backplane and located below the diffusion plate, and an optic film assembly disposed on the diffusion plate and the backlight source of Step 4 is disposed on the backplane, the LED lamps projecting through the reflector plate and extending under the diffusion plate to form a direct backlight module.

The PCB provided in Step 1 is of a strip form.

The PCB is formed of two PCB units jointed to each other.

In Step 7, the PCB on which the LED lamps are positioned is first removed out of the backlight module main body and soldering is then applied to fix the LED lamps to the PCB.

The efficacy of the present invention is that the present invention provides a method for mounting a light bar that enhances central point brightness of a backlight module, which uses LED lamps of different specifications and adjusts the spacing distance between the LED lamps to adjust the central point brightness and illumination homogeneity of the LED light bar so as to ensure the central point brightness and illumination homogeneity of the backlight module and enhance optic grade of the backlight module. Further, the LED light bar can be manufactured by using several types of LED lamps that are of relatively low costs so as to lower down the manufacture cost under the condition that the central point brightness and illumination homogeneity of the backlight module are ensured.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, will be apparent from the following detailed description of an embodiment of the present invention, with reference to the attached drawings. In the drawings:

FIG. 1 is a schematic view showing a conventional LED (Light-Emitting Diode) light bar of backlight source;

FIG. 2 is a flow chart illustrating a method for mounting a light bar that enhances central point brightness of a backlight module according to the present invention;

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIGS. 2-7, the present invention provides a method for mounting a light bar that enhances central point brightness of a backlight module, which comprises the following steps:

Step 1: providing a printed circuit board (PCB) 20 and a plurality of light-emitting diode (LED) lamps 40 of various specifications. The LED lamps 40 of various specifications are of different luminous intensities. Difference of luminous intensity among the plurality of LED lamps 40 is less than 20%.

Figure 3:
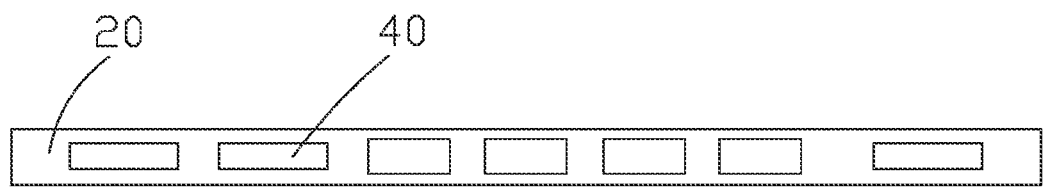
FIG. 3 is a schematic view showing an embodiment of a light bar manufactured with the method for mounting a light bar that enhances central point brightness of a backlight module according to the present invention.
Figure 4:
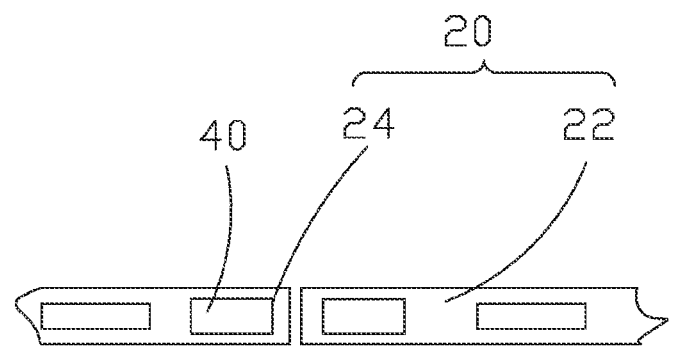
FIG. 4 is a schematic view showing another embodiment of a light bar manufactured with the method for mounting a light bar that enhances central point brightness of a backlight module according to the present invention.

The PCB 20 is of a strip form, which can be a single unitary strip (as shown in FIG. 3) or can alternatively be a plurality of PCB units jointed to each other. As shown in FIG. 4, the PCB 20 is formed of two PCB units 22, 24 jointed to each other.

The LED lamps 40 of various specifications can be LED lamps 40 of different sizes or can alternatively be different types of LED lamps 40 of identical size. The LED lamps 40 of different types can be LED lamps 40 that use different fluorescent powders or adopts different driving conditions. The different driving conditions can be different driving voltage. Preferably, the LED lamps 40 are selected to be LED lamps of relatively low cost for cost control purposes.

In the instant embodiment, LED lamps 40 of two different specifications are selected, of which the model numbers are respectively 5630 and 7020. The two types of LED lamps 40 are of different packaging sizes, wherein model number 5630 has a thickness of 0.3 mm and model number 7020 has a thickness of 0.2 mm and which when driven by corresponding driving voltages show luminous intensities of relatively small difference. The luminous intensities of these LED lamps 40 are measured and a number of the LED lamps 40 that show luminous intensities having a difference less than 20% are selected.

Step 2: positioning the number of LED lamps 40 on the PCB 20 in a spaced manner and electrically connected to the PCB 20, wherein LED lamps 40 having high luminous intensities are positioned at locations close to a central location of the PCB 20 in order to ensure the central point brightness of the LED lamps 40 and thus ensuring the central point brightness of the backlight module.

Step 3: providing a backlight module main body 60, wherein the backlight module main body 60 can be added with a backlight source to form a backlight module.

Step 4: positioning the PCB 20 on which the LED lamps 40 are positioned on the backlight module main body 60 to serve as a backlight source 420 thereby forming the backlight module.

Figure 5:
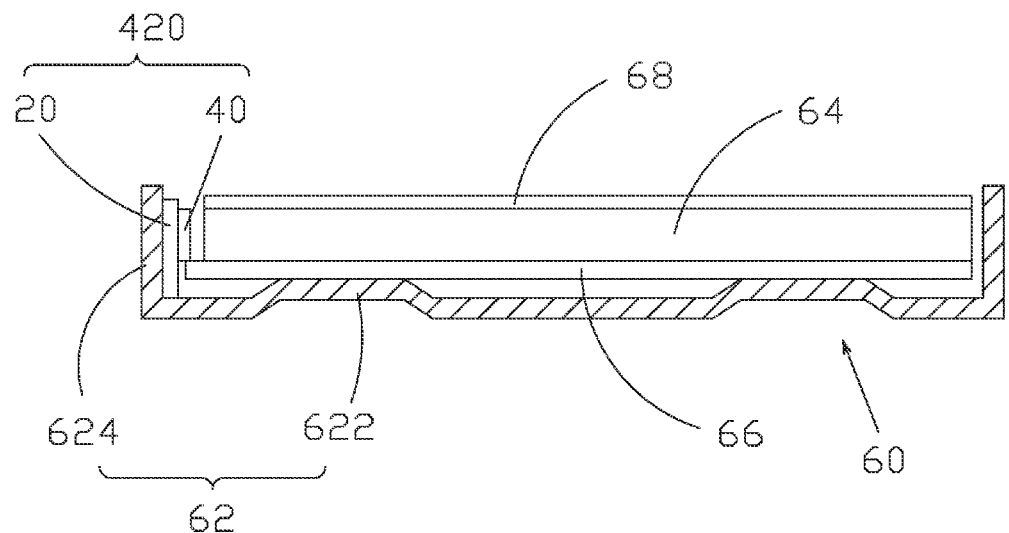
FIG. 5 is a schematic view showing an embodiment of a backlight module main body adopted in the present invention.

Referring to FIG. 5, which is a schematic view showing an embodiment of the backlight module main body 60 adopted in the present invention, in the instant embodiment, the backlight module main body 60 comprises: a backplane 62, a light guide plate 64 mounted on the backplane 62, a reflector plate 66 arranged inside the backplane 62 and located below the light guide plate 64, and an optic film assembly 68 disposed on the light guide plate 64. The backplane 62 comprises a bottom board 622 and side boards 624 connected to the bottom board 622. The backlight source 420 is arranged by one side of the light guide plate 64 and is mounted to the side boards 624 of the backplane 62 to form a side-edge backlight module.

Figure 6:
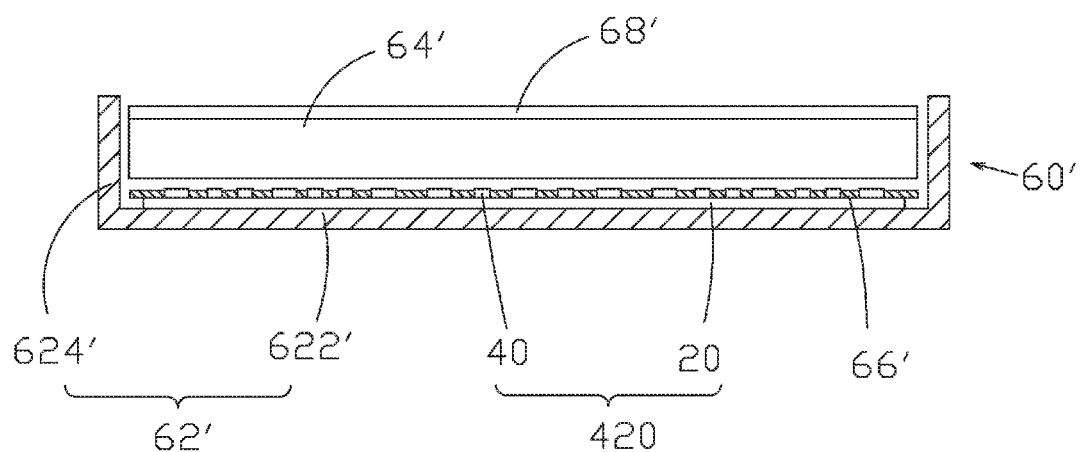
FIG. 6 is a schematic view showing another embodiment of the backlight module main body adopted in the present invention.

Referring to FIG. 6, which is a schematic view showing an embodiment of the backlight module main body 60' adopted in the present invention, in the instant embodiment, the backlight module main body 60' comprises: a backplane 62', a diffusion plate 64' arranged above the backplane 62', a reflector plate 66' arranged inside the backplane 62' and located below the diffusion plate 64', and an optic film assembly 68' disposed on the diffusion plate 64'. The backplane 62' comprises a bottom board 622' and side boards 624' connected to the bottom board 622'. The backlight source 420 is disposed on the bottom board 622' of the backplane 62'. The LED lamps 40 project through the reflector plate 66' and extend under the diffusion plate 64' to form a direct backlight module.

Step 5: measuring central point brightness and illumination homogeneity of the backlight module.

Step 6: adjusting the spacing distance between the LED lamps 40 of the PCB 20 according to predetermined central point brightness and illumination homogeneity so as to have the central point brightness and illumination homogeneity of the LED lamps 40 satisfying requirements.

Figure 7:
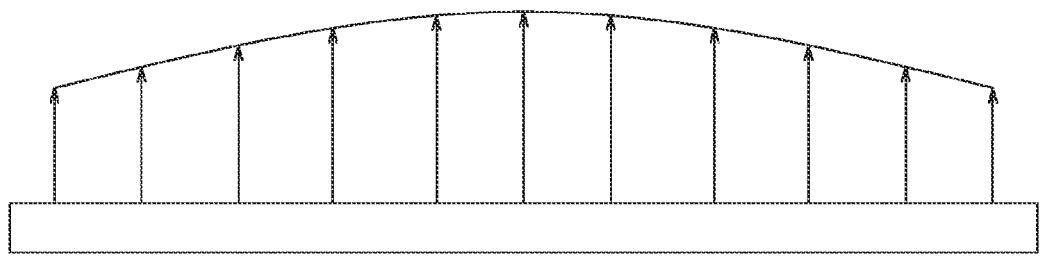
FIG. 7 shows a plot of luminous intensity of a backlight module that uses a light bar manufactured with the method for mounting a light bar that enhances central point brightness of a backlight module according to the present invention as a backlight source.

For example, in an application to a backlight module of 32-inch liquid crystal display device, the required central point brightness is 300 nits and the required illumination homogeneity is greater tan or equal to 80%. In an application to a backlight module of 46-inch liquid crystal display device, the required central point brightness is 400 nits and the required illumination homogeneity is greater tan or equal to 75%. The spacing distance between the LED lamps 40 is adjusted so that the central point brightness and illumination homogeneity can satisfy the above requirements. Preferably, the spacing distance between the LED lamps 40 is adjusted so that the central point brightness of the backlight module is of a maximum level and the brightness of the two sides thereof is uniformly reduced in a stepped manner (as shown in FIG. 7).

Taking the backlight module of 32-inch liquid crystal display device as an example to explain the process of adjusting the spacing distance between the LED lamps:

The central point brightness of the backlight module is first identified. The measured central point brightness of the backlight module is compared with the required value of 300 nits. If the measured value of central point brightness of the backlight module is greater than 300 nits, the spacing distance between the LED lamps 40 that are located in a central position of the PCB 20 is gradually increased to such a distance that the measured value is equal to the required value of 300 nits. Similarly, if the measured value of central point brightness of the backlight module is smaller than 300 nits, the spacing distance between the LED lamps 40 located in the central position of the PCB 20 is gradually decreased to such a distance that the measured value is equal to the required value of 300 nits.

The illumination homogeneity of the backlight module is then identified. A plurality of test points is selected for each side of the central point of the backlight module. Taking four test points as an example, for easy description, the four test points of each side of the central point of the backlight module are sequentially designated as first, second, third, and fourth test points from the smallest value to the largest value of the distances thereof from the central point. The brightness is first determined for the first test point that is closest to the central point. The brightness of the first test point is required to be slightly smaller than the central point brightness and actual value can be determined according to practical manufacturing. If the brightness of the first test point is greater than the central point brightness of 300 nits, the LED lamp 40 at the location corresponding to the first test point is adjust to increase the spacing distance thereof with respect to the central point. Under this condition, it is necessary to observe if the movement of the LED lamp 40 affects the central point brightness of the backlight module. If it is affected, then the LED lamp 40 is replaced by a different model number to eliminate the influence. For example, the LED lamps 40 at the central position are replaced with LED lamps 40 of high luminous intensity in order to maintain the value of the central point brightness to be 300 nits. The brightness of the second, third, and four test points are sequentially adjusted in the same way to ensure that the brightness of the first, second, third, and fourth test points is gradually decreased and the difference of brightness thereof from the central point brightness is not greater than 20%.

Applying again the above process to determine the brightness of a plurality of test points at the other side of the central point brightness so that the brightness of the test points is sequentially reduced and the difference of brightness thereof from the central point brightness is not greater than 20%.

Step 7: mounting the LED lamps 40 to the PCB 20 so as to form an LED light bar.

In Step 7, the PCB 20 with the LED lamps 40 positioned thereon and satisfying the requirements of central point brightness and illumination homogeneity is first removed out of the backlight module main body 60 and soldering is then applied to fix the LED lamps 40 to the PCB 20 to form a finished product of LED light bar. Finally, the brightness, positions, and spacing distance of the LED lamps 40 of the PCB 20 are confirmed and recorded for subsequent operation of mass production.

The present invention provides a method for mounting a light bar that enhances central point brightness of a backlight module, which uses LED lamps of different specifications and adjusts the spacing distance between the LED lamps to adjust the central point brightness and illumination homogeneity of the LED light bar so as to ensure the central point brightness and illumination homogeneity of the backlight module and enhance optic grade of the backlight module. Further, the LED light bar can be manufactured by using several types of LED lamps that are of relatively low costs so as to lower down the manufacture cost under the condition that the central point brightness and illumination homogeneity of the backlight module are ensured.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A method for mounting a light bar that enhances central point brightness of a backlight module, comprising the following steps:
   (1) providing a PCB and a plurality of LED lamps of various specifications, wherein the LED lamps of various specifications are of different luminous intensities, difference of luminous intensity among the plurality of LED lamps being less than 20%;
   (2) positioning the plurality of LED lamps on the PCB in a spaced manner and electrically connected to the PCB, wherein LED lamps having high luminous intensities are positioned at locations close to a central location of the PCB;
   (3) providing a backlight module main body, wherein the backlight module main body is addible with a backlight source to form a backlight module;
   (4) positioning the PCB on which the LED lamps are positioned on the backlight module main body to serve as a backlight source thereby forming the backlight module;
   (5) measuring central point brightness and illumination homogeneity of the backlight module;
   (6) adjusting the spacing distance between the LED lamps of the PCB according to predetermined central point brightness and illumination homogeneity so as to have the central point brightness and illumination homogeneity of the LED lamps satisfying requirements; and
   (7) mounting the LED lamps to the PCB so as to form an LED light bar.

2. The method for mounting a light bar that enhances central point brightness of a backlight module as claimed in claim 1, wherein the plurality of LED lamps of various specifications is of two specifications.

3. The method for mounting a light bar that enhances central point brightness of a backlight module as claimed in claim 1, wherein the LED lamps of various specifications are LED lamps of different sizes or LED lamps of identical size but different types.

4. The method for mounting a light bar that enhances central point brightness of a backlight module as claimed in claim 3, wherein the LED lamps of different types are LED lamps using different fluorescent powders or different driving conditions.

5. The method for mounting a light bar that enhances central point brightness of a backlight module as claimed in claim 4, wherein the LED lamps using different driving conditions are LED lamps using different driving voltages.

6. The method for mounting a light bar that enhances central point brightness of a backlight module as claimed in claim 1, wherein the backlight module main body of Step 3 comprises: a backplane, a light guide plate mounted on the backplane, a reflector plate arranged inside the backplane and located below the light guide plate, and an optic film assembly disposed on the light guide plate and the backlight source of Step 4 is arranged by one side of the light guide plate, to form a side-edge backlight module.

7. The method for mounting a light bar that enhances central point brightness of a backlight module as claimed in claim 1, wherein the backlight module main body of Step 3 comprises: a backplane, a diffusion plate arranged above the backplane, a reflector plate arranged inside the backplane and located below the diffusion plate, and an optic film assembly disposed on the diffusion plate and the backlight source of Step 4 is disposed on the backplane, the LED lamps projecting through the reflector plate and extending under the diffusion plate to form a direct backlight module.

8. The method for mounting a light bar that enhances central point brightness of a backlight module as claimed in claim 1, wherein the PCB provided in Step 1 is of a strip form.

9. The method for mounting a light bar that enhances central point brightness of a backlight module as claimed in claim 8, wherein the PCB is formed of two PCB units jointed to each other.

10. The method for mounting a light bar that enhances central point brightness of a backlight module as claimed in claim 1, wherein in Step 7, the PCB on which the LED lamps are positioned is first removed out of the backlight module main body and soldering is then applied to fix the LED lamps to the PCB.

11. A method for mounting a light bar that enhances central point brightness of a backlight module, comprising the following steps:

(1) providing a PCB and a plurality of LED lamps of various specifications, wherein the LED lamps of various specifications are of different luminous intensities, difference of luminous intensity among the plurality of LED lamps being less than 20%;

(2) positioning the plurality of LED lamps on the PCB in a spaced manner and electrically connected to the PCB, wherein LED lamps having high luminous intensities are positioned at locations close to a central location of the PCB;

(3) providing a backlight module main body, wherein the backlight module main body is addible with a backlight source to form a backlight module;

(4) positioning the PCB on which the LED lamps are positioned on the backlight module main body to serve as a backlight source thereby forming the backlight module;

(5) measuring central point brightness and illumination homogeneity of the backlight module;

(6) adjusting the spacing distance between the LED lamps of the PCB according to predetermined central point brightness and illumination homogeneity so as to have the central point brightness and illumination homogeneity of the LED lamps satisfying requirements; and (7) mounting the LED lamps to the PCB so as to form an LED light bar;

wherein the plurality of LED lamps of various specifications is of two specifications;

wherein the LED lamps of various specifications are LED lamps of identical size but different types;

wherein the LED lamps of different types are LED lamps using different driving conditions;

wherein the LED lamps using different driving conditions are LED lamps using different driving voltages;

wherein the backlight module main body of Step 3 comprises: a backplane, a light guide plate mounted on the backplane, a reflector plate arranged inside the backplane and located below the light guide plate, and an optic film assembly disposed on the light guide plate and the backlight source of Step 4 is arranged by one side of the light guide plate, to form a side-edge backlight module;

wherein the PCB provided in Step 1 is of a strip form;

wherein in Step 7, the PCB on which the LED lamps are positioned is first removed out of the backlight module main body and soldering is then applied to fix the LED lamps to the PCB.

* * * * *